United States Patent
Teo et al.

(10) Patent No.: US 8,308,969 B2
(45) Date of Patent: Nov. 13, 2012

(54) PLASMA SYSTEM FOR IMPROVED PROCESS CAPABILITY

(75) Inventors: Kenneth B. K. Teo, Cambridge (GB); Nalin L. Rupesinghe, Cambridge (GB)

(73) Assignee: Aixtron, SE, Herezogenrath (DE)

( * ) Notice: Subject to any disclaimer, the term of this patent is extended or adjusted under 35 U.S.C. 154(b) by 484 days.

(21) Appl. No.: 12/531,052

(22) PCT Filed: Mar. 11, 2008

(86) PCT No.: PCT/EP2008/052854
§ 371 (c)(1),
(2), (4) Date: Sep. 11, 2009

(87) PCT Pub. No.: WO2008/110547
PCT Pub. Date: Sep. 18, 2008

(65) Prior Publication Data
US 2010/0116791 A1    May 13, 2010

Related U.S. Application Data

(60) Provisional application No. 60/905,972, filed on Mar. 12, 2007.

(51) Int. Cl.
*C03C 15/00* (2006.01)
*C03C 25/68* (2006.01)
*C23F 1/00* (2006.01)
*H01L 21/306* (2006.01)

(52) U.S. Cl. ... 216/71; 216/67; 156/345.43; 156/345.45

(58) Field of Classification Search ............. 156/345.43; 216/71
See application file for complete search history.

(56) References Cited

U.S. PATENT DOCUMENTS

| | | | |
|---|---|---|---|
| 4,676,865 A * | 6/1987 | DeLarge | 216/71 |
| 5,614,026 A * | 3/1997 | Williams | 118/723 ME |
| 2005/0000430 A1 | 1/2005 | Jang et al. | |
| 2005/0214477 A1* | 9/2005 | Hanawa et al. | 427/569 |
| 2006/0037700 A1* | 2/2006 | Shi et al. | 156/345.43 |
| 2007/0187812 A1 | 8/2007 | Izumi | |
| 2008/0286697 A1* | 11/2008 | Verhaverbeke et al. | 430/322 |

FOREIGN PATENT DOCUMENTS

| EP | 1 152 646 A | 11/2001 |
|---|---|---|
| EP | 1 594 161 A | 11/2005 |
| WO | 2005/122230 A | 12/2005 |

OTHER PUBLICATIONS

Aixtron AG; PCT/EP08/052854 filed Mar. 11, 2008; international Search Report and Written Opinion; ISA/EP; Jul. 11, 2008; 13pp.

* cited by examiner

*Primary Examiner* — Shamim Ahmed
*Assistant Examiner* — Bradford Gates
(74) *Attorney, Agent, or Firm* — Tarek N. Fahmi, APC

(57) ABSTRACT

A plasma system for substrate processing comprising, a conducting electrode (b, bb) on which one or more substrates (d) can be held; a second conducting electrode (a) placed adjacent but separated from the substrate holding electrode on the side away from the side where the substrates are held; and a gas mixture distribution shower head (e) placed away from the conducting electrode on the side where the substrates are held for supplying the gas mixture (f) needed for processing the substrates in a uniform manner; such that a plasma configuration initiated and established, between the conducting electrode holding the substrates and the second conducting electrode envelops the electrode holding the substrate, is kept away from the shower head activating and distributing the gas mixture through orifices (ee) in the shower head, thereby providing the advantages of improved uniformity, yield and reliability of the process.

10 Claims, 2 Drawing Sheets

Novel Plasma System for improved process capability

PLASMA SYSTEM FOR IMPROVED PROCESS CAPABILITY

CROSS REFERENCES TO RELATED APPLICATIONS

The present patent application is a National Stage under 35 USC 365 and claims priority to PCT International Application No. PCT/EP2008/052854 filed Mar. 11, 2008, incorporated herein by reference, which claims priority benefit from U.S. Provisional Application No.: 60/905,972 filed Mar. 12, 2007.

FIELD OF INVENTION

The field of invention is in the innovative plasma generation for plasma equipments in general and specifically those used for substrate processing including cleaning, etching, deposition of films, and growth of films and structures.

SUMMARY

Typical plasma systems use parallel electrodes with DC, AC or RF voltage to generate the plasma across the plates for substrate process applications, including cleaning, etching, depositing and growth of structures. One of the electrodes, typically the bottom one, acts as the substrate holder during plasma processing. The combination of gases (gas mixture) necessary during processing is fed typically through the top electrode. In order to make the gas flow uniform and reduce the plasma residence time of the reacted species, a shower head structure is used for distribution of the gas mixture. This means that there are apertures on the top electrode forming a shower head structure for uniformity of gas flow.

There are multiple problems with this approach of using parallel plate technology for plasma generation, including:
  a) contamination of the substrate by the material of the electrode, due to sputtering of the electrode due to the energetic particles generated in the plasma hitting the top electrode;
  b) particle generation at the shower head that affects the defect density and cleanliness of the processed substrate; and
  c) the deposition of plasma generated components on or near the shower head getting deposited on the apertures or orifices of the shower head leading to closure of the apertures resulting in non-uniform gas flow and non uniform plasma.

A novel method of generating and configuring plasma using a back side electrode (electrode placed on the opposite side of the substrate holder) is disclosed. The generated plasma envelops the substrate holder electrode thereby eliminating contamination by direct sputtered deposition on the substrate; and formation and deposition of particles from the top electrode during processing. It also eliminates the closure of the gas shower head which now can be made of a non-conducting material which is kept out of the plasma stream. Hence a novel plasma configuration, and apparatus and method for generating same is disclosed. This plasma configuration overcomes the problems of the prior art mentioned, for improved yield and reliable processing on any chosen substrate.

BACKGROUND AND PRIOR ART

FIG. 1 is an example of the plasma system and plasma configuration of the prior art. Two parallel conducting plates, a top plate (aa) and a bottom plate (bb) with terminals for connection (a) and (b) to the voltage supply is shown. The top plate has uniformly placed apertures (ee) forming a shower head structure. Plasma is struck between the electrodes (aa) and (bb) using either a DC voltage, an AC (or RF) voltage or a pulsed voltage waveform applied to terminals (a) and (b). The gas mixture (f) for the processing passes through the orifices or apertures (ee) of the shower head providing uniform reaction capability in the plasma chamber when plasma C is on between the electrodes (aa) and (bb). The substrate (d) to be processed sits encased in the plasma during processing. The gas mixture (f) and the plasma conditions, like pressure, applied voltage, bias provided etc. define the process accomplished. The processing itself can be a cleaning process, an etching process, a deposition process or a process for chemical functionalization of surfaces.

The shown exemplary prior art processes have a number of problems. They include:
  a) When a plasma (c) is lighted (initiated) the gas mixture supplied through the orifices (ee) in the second conducting electrode (aa) to the chamber is ionized, that is there are positive and negative particles that exist in the plasma (c) and depending on the applied voltages they are accelerated towards the electrodes with energy. When the energetic ions strike the substrate (d) they accomplish the process operation, but when the opposite charged particles strike the other electrode (aa), there is unwanted energy transfer to the electrode. Depending on the energy these ions can sputter material from the electrode (aa) which can then get deposited on the substrate (d) and contaminating the substrate (d). Since the energy of the ions is a random vector, it is not possible to completely eliminate this contamination due to electrode sputtering in the prior art plasma configuration.
  b) During plasma processing the mixed gases (f) are being delivered to the plasma chamber (c) through the apertures (ee) in the second plate electrode (aa). Since the plasma (c) extends across the gap between the top and bottom electrodes there is possibility of chemical reactions at the second electrode (aa). These reactions can result in formation of particulates that can then be attracted to the substrate (d) and stick to the substrate creating unwanted particle on substrate. This can result in increased defect density and low yield of processed substrate.
  c) Since the chemical reactions can happen in the plasma at the shower head which is the second electrode (aa), there is a possibility of the reactants accumulating on the shower head or second electrode (aa). This can lead to the apertures (ee) in the second electrode (aa) getting blocked during processing, resulting in non-uniformity of the process gas supply and gas stream (flow) modification. This in turn can make the process out of control leading to un-wanted results and yield loss on the processed substrate. This can also necessitate frequent cleaning and replacement of the second electrode (aa), which forms the shower head, increasing the process cost.

WHAT IS PROPOSED

What is proposed is a novel method of using a back side electrode to initiate and maintain the plasma in a process chamber. This enables the plasma to be configured in such a way as to envelop the electrode with the substrate while shielding the substrate from direct contamination from sputtering, particle deposition and gas stream modification. This and other advantages of the disclosed apparatus and method are novel in nature and solve problems that have existed for a long time in plasma processing.

DETAILED EXPLANATION OF THE INVENTION

Figure 1:
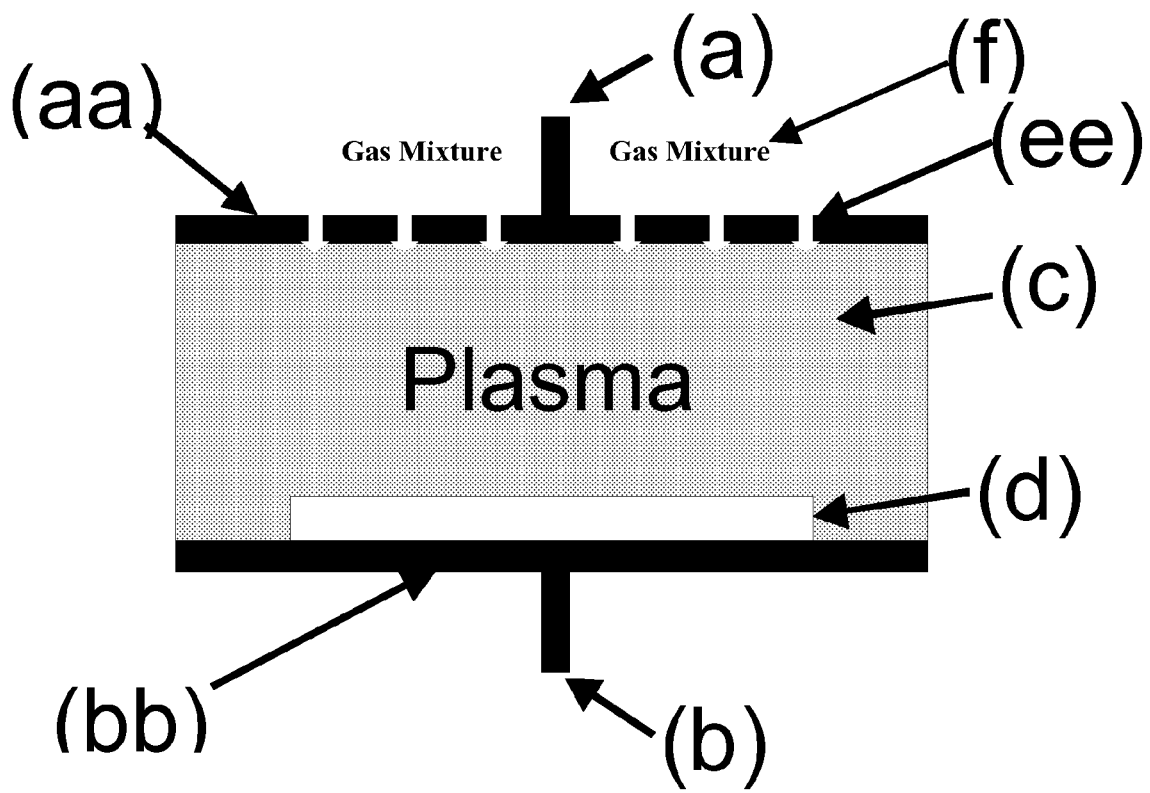
FIG. 1 is an exemplary prior art plasma processing system.
Figure 2:
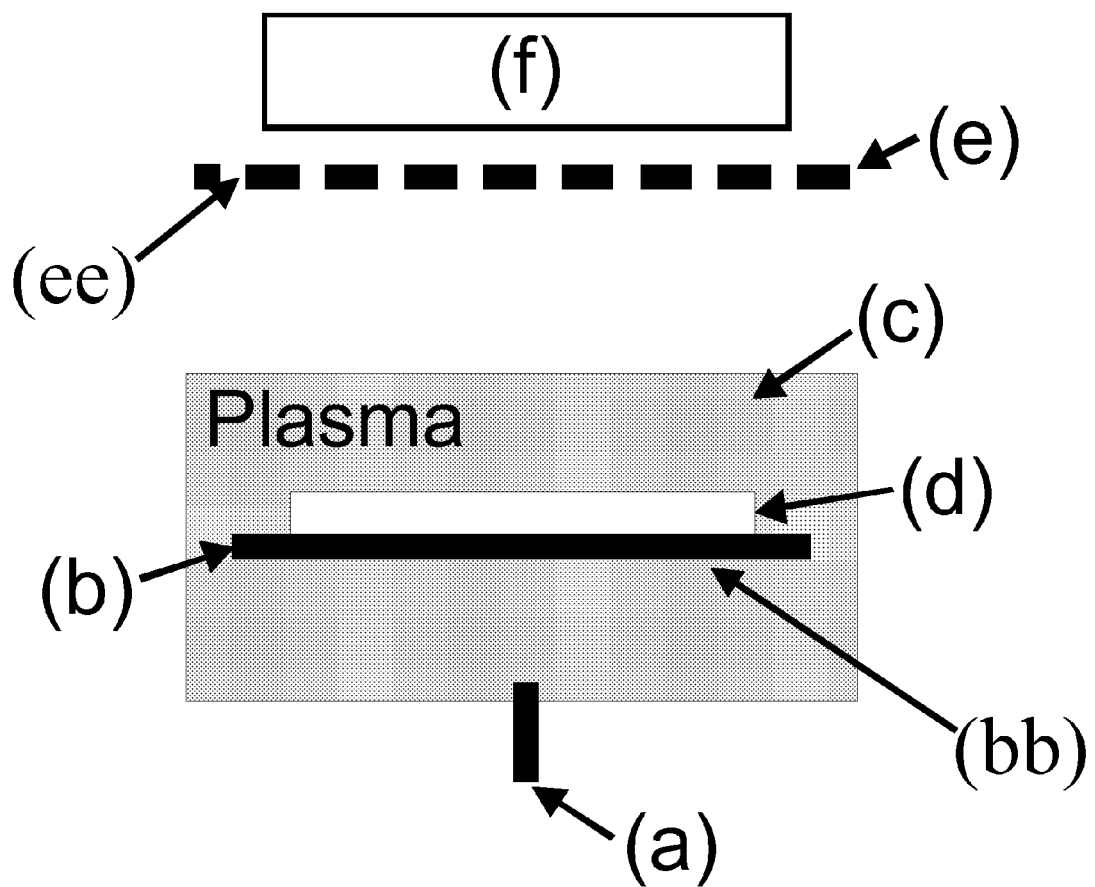
FIG. 2 is an exemplary system as disclosed with a single rod type back electrode.

FIG. 2 is an exemplary plasma configuration and system of the disclosure. The system consists of a base plate (bb) with an electrical connection (b) on which the substrate to be processed (d) is placed. A small electrical conductor in the form of a rod (a) or a small plate (not shown) or a ring (not shown) is disposed on the side opposite the side of the plate (bb) where the substrate (d) is placed. When plasma is ignited the plasma (c) configuration is different from the typical parallel plate system in that it envelops the sides of the plate (bb) holding the substrate (d) as shown in FIG. 2. The gas mixture (f) necessary for the processing is input into the plasma space through apertures (ee) in a non-conducting shower head (e) which is kept out of the plasma region and is not part of the electrical input circuit of the plasma system.

In the final configuration, the plasma (c) is generated between electrodes (a) and (b). A voltage, which can be DC, AC (or RF) or a pulsed waveform, is applied between (a) and (b). Either electrode (a) or (b) can be grounded. The plasma envelops electrode (b) on which the substrate (d) rests. Substrate (d) is then plasma processed (cleaning, deposition, etching or functionalization). Electrode (b), on which the substrate rests, can also be heated or used as a heater as required by the process.

This plasma configuration has the advantage that it overcomes most of the problems and issues associated with the prior art systems as explained below.

a) Since the plasma (c) exists around the electrode or plate (bb) holding the substrate (d), complete coverage of the plate (bb) by plasma exists. This will improve the uniformity of the process over the total substrate (d).

b) Due to the plasma (c) being lighted between the electrode or plate (bb) holding the substrate (d) and the second electrode (a) on the opposite side of the plate (bb) holding the substrate (d), the substrate (d) is not in line-of-sight of the second electrode (a). This eliminates direct contamination of the substrate (d) due to sputtering from the second electrode (a).

c) Use of a non-conducting and non-reactive material for shower head (e) is possible as this is no longer used as a conducting electrode. This allows optimization of the shower head material for the gas distribution only. This new shower head (e) is also placed outside the plasma (c) influence to prevent any reactions or sputtering from taking place. These eliminate any contamination of the substrate (d) from the shower head (e) completely.

d) Since the gas supply (f) to the plasma (c) is through orifices (ee) in a non conducting shower head (e) which is kept out of the plasma (c) configured surrounding the substrate holder electrode (bb), there is no chemical reaction happening at the gas inlet (ee). This prevents formation of particles in the gas inlet stream, and therefore reduces the particulate contamination of the substrate (d). This has the advantage of increasing the yield and reliability of the process.

e) Since no chemical reactions happen at the shower head (e), there is reduced chance of build up of reactant by products accumulating on the shower head (d) and resultant closing of the orifices (ee) of the shower head (e). This will allow uniform gas flow during process with resultant improvement of uniformity of process and yield. This also eliminates the need for frequent process stoppage and down time for system cleaning, allowing better throughput and reducing the process cost.

f) Since the gas mixture region is now isolated above the non-conductive shower head (e), other strategies for gas mixing or gas activation (e.g., hot wire) can be conveniently implemented.

These advantages make the new plasma configuration using the modified equipment for plasma processing of substrates novel and unique. The resultant substrates provide higher yield, better reliability and a lower cost of process, by overcoming the disadvantages and problems of the prior art plasma configuration using the parallel plate systems.

What is claimed is:

1. A plasma system for substrate processing, comprising:
a first conducting electrode (bb) having a first side on which one or more substrates (d) can be supported and having a second side opposite the first side;
a second conducting electrode (a) placed adjacent to but separated from the first conducting electrode (bb) on the second side; and
a gas mixture distribution shower head (e) placed away from the first conducting electrode (bb) on the first side and within line-of-sight of at least one of the substrates, the gas mixture distribution shower head configured to supply a gas mixture (f) for processing the substrates,
the first and second conducting electrodes (bb) and (a), respectively, and the shower head (e) arranged with respect to one another such that a plasma (c) is initiated and established between the first conducting electrode (bb) and the second conducting electrode, enveloping at least one of the substrates held by the first conducting electrode and is kept away from the shower head (e) activating and distributing the gas mixture through orifices (ee) in the shower head (e).

2. The plasma system according to claim 1, wherein the shower head (e) is manufactured from a non-conductive material that is non-reactive with the gas mixture.

3. A method, comprising:
establishing, in a substrate processing apparatus, a plasma configuration that envelops a first conductive electrode (bb) for supporting a substrate(d), the plasma configuration generated between the first conductive electrode (bb) and a second conductive electrode (a) located in close proximity to, but separated from, the first conductive electrode (bb) on a side of the first conductive electrode opposite a side on which the substrate (d) is supported, such that the plasma configuration is kept away from a shower head (e) used to input a gas mixture (f) through orifices (ee) in the shower head, wherein the shower head is disposed within line-of-sight of the substrate (d).

4. The method according to claim 3, wherein the shower head (e) is manufactured from a non-conductive material that is non-reactive with the gas mixture.

5. The method according to claim 3, wherein a DC voltage is applied between the first conductive electrode (bb) and the second conductive electrode (a).

6. The method according to claim 3, wherein an AC voltage is applied between the first conductive electrode (bb) and the second conductive electrode (a).

7. The method according to claim 3, wherein a pulsed voltage is applied between the first conductive electrode (bb) and the second conductive electrode (a).

8. The method according to claim 3, wherein one of the first conductive electrode (bb) and the second conductive electrode (a) is grounded.

9. The method according to claim 3, wherein the first conductive electrode (bb) is heated.

10. The plasma system according to claim 1, wherein the first conducting electrode (bb) is configured for use as a heater.

* * * * *